United States Patent
Sturcken

(10) Patent No.: US 9,357,650 B2
(45) Date of Patent: May 31, 2016

(54) METHOD OF MAKING MAGNETIC CORE INDUCTOR INTEGRATED WITH MULTILEVEL WIRING NETWORK

(75) Inventor: Noah Andrew Sturcken, New York, NY (US)

(73) Assignee: Ferric Inc., New York, NY (US)

( * ) Notice: Subject to any disclaimer, the term of this patent is extended or adjusted under 35 U.S.C. 154(b) by 727 days.

(21) Appl. No.: 13/613,011

(22) Filed: Sep. 13, 2012

(65) Prior Publication Data

US 2014/0068932 A1 Mar. 13, 2014

Related U.S. Application Data

(63) Continuation of application No. 13/609,391, filed on Sep. 11, 2012.

(51) Int. Cl.
| | |
|---|---|
| H05K 1/18 | (2006.01) |
| H05K 1/16 | (2006.01) |
| H05K 1/11 | (2006.01) |
| H05K 1/02 | (2006.01) |

(52) U.S. Cl.
CPC .............. *H05K 1/181* (2013.01); *H05K 1/0298* (2013.01); *H05K 1/115* (2013.01); *H05K 1/165* (2013.01); *H05K 1/0233* (2013.01); *H05K 2201/086* (2013.01); *H05K 2201/0929* (2013.01); *H05K 2201/1003* (2013.01); *Y02P 70/611* (2015.11); *Y10T 29/4913* (2015.01)

(58) Field of Classification Search
CPC .............. H01L 21/02008; H01L 21/02104; H01L 21/02107; H01L 21/02112; H01L 21/02505; H05K 1/0233; H05K 1/0298; H05K 1/115; H05K 1/165; H05K 1/181; H05K 2201/086; H05K 2201/0929; H05K 2201/1003; Y02P 70/611; Y10T 29/4913

See application file for complete search history.

(56) References Cited

U.S. PATENT DOCUMENTS

| | | | |
|---|---|---|---|
| 1,553,983 | A | 9/1925 | Casper |
| 2,931,966 | A | 4/1960 | Rockey |
| 3,614,554 | A | 10/1971 | Shield et al. |

(Continued)

FOREIGN PATENT DOCUMENTS

| | | |
|---|---|---|
| FR | 2817622 A1 | 6/2002 |
| JP | 60124859 | 7/1985 |

(Continued)

OTHER PUBLICATIONS

D. W. Lee et al., "Design and Fabrication of Integrated Solenoid Inductors with Magnetic Cores", Electronic Components and Technology Conference, 2008, p. 701-705, IEEE.

(Continued)

*Primary Examiner* — Carl Arbes
(74) *Attorney, Agent, or Firm* — Intrinsic Law Corp.; Ibrahim M. Hallaj

(57) ABSTRACT

An inductor is integrated into a multilevel wiring network of a semiconductor integrated circuit. The inductor includes a planar magnetic core and a conductive winding. The conductive winding turns around in generally spiral manner on the outside of the planar magnetic core. The conductive winding is piecewise constructed of wire segments and of VIAs. The wire segments pertain to at least two wiring planes and the VIAs are interconnecting the at least two wiring planes. Methods for such integration, and for fabricating laminated planar magnetic cores are also presented.

6 Claims, 11 Drawing Sheets

(56) References Cited

U.S. PATENT DOCUMENTS

| | | | |
|---|---|---|---|
| 5,070,317 | A | 12/1991 | Bhagat |
| 5,225,971 | A | 7/1993 | Spreen |
| 5,319,343 | A | 6/1994 | Jeffries |
| 5,583,474 | A | 12/1996 | Mizoguchi |
| 5,635,892 | A | 6/1997 | Ashby |
| 6,362,986 | B1 | 3/2002 | Schultz |
| 6,542,060 | B2 | 4/2003 | Fedeli |
| 6,542,379 | B1 | 4/2003 | Lauffer et al. |
| 6,856,226 | B2 | 2/2005 | Gardner |
| 6,940,384 | B2 | 9/2005 | Hooey et al. |
| 7,636,242 | B2 | 12/2009 | Hazucha |
| 7,719,084 | B2 | 5/2010 | Gardner |
| 7,867,787 | B2 | 1/2011 | Gardner |
| 8,108,984 | B2 | 2/2012 | Gardner |
| 2003/0070282 | A1 | 4/2003 | Hiatt et al. |
| 2005/0088269 | A1 | 4/2005 | Hatano et al. |
| 2007/0290362 | A1 | 12/2007 | Hsu et al. |
| 2009/0175014 | A1 | 7/2009 | Zeng et al. |
| 2009/0188104 | A1 | 7/2009 | Ching et al. |
| 2011/0279214 | A1 | 11/2011 | Lee et al. |
| 2013/0056847 | A1 | 3/2013 | Chen |
| 2014/0027879 | A1 | 1/2014 | Weyers et al. |

FOREIGN PATENT DOCUMENTS

| | | | |
|---|---|---|---|
| JP | 05082736 | A * | 4/1993 |
| JP | 05291063 | | 11/1993 |
| JP | H09162354 | A * | 6/1997 |

OTHER PUBLICATIONS

N. Sturcken et al., "A 2.5D Integrated Voltage Regulator Using Coupled-Magnetic-Core Inductors on Silicon Interposer Delivering 10.8A/mm", International Solid-State Circuits Conference, 2012, p. 3-5, Session 23, IEEE.

N. Sturcken et al., "A 2.5D Integrated Voltage Regulator Using Coupled- Magnetic-Core Inductors on Silicon Interposer Delivering 10.8A/mm2" ISSCC 2012, 23.1.

N. Sturcken et al., "Design of Coupled Power Inductors with Crossed Anisotropy Magnetic Core for Integrated Power Conversion" IEEE-APEC 2012, pp. 417-423, doi: 10.1109/APEC.2012.6165853.

N. Sturcken, R. Davies, C. Cheng, W.E. Bailey, K. L. Shepard, "Design of Coupled Power Inductors with Crossed Anisotropy Magnetic Core for Integrated Power Conversion", Columbia University, New York, NY, USA.

* cited by examiner

METHOD OF MAKING MAGNETIC CORE INDUCTOR INTEGRATED WITH MULTILEVEL WIRING NETWORK

CROSS REFERENCE TO A RELATED APPLICATION

This application is a Continuation of application Ser. No. 13/609,391, filed Sep. 11, 2012, which is incorporated herein by reference in its entirety.

BACKGROUND

The present invention relates to electronic devices of very large scale integration circuits. In particular, it relates to devices that deliver supply voltages for the circuits.

BRIEF SUMMARY

An inductor is integrated into a multilevel wiring network of a semiconductor integrated circuit. The inductor includes a planar magnetic core and a conductive winding. The conductive winding turns around in generally spiral manner on the outside of the planar magnetic core. The conductive winding is piecewise constructed of wire segments and of VIAs. The wire segments pertain to at least two wiring planes and the VIAs are interconnecting the at least two wiring planes.

A method for integrating an inductor into a multilevel wiring network of a semiconductor integrated circuit and fabrication schemes of laminated magnetic cores for the inductor are also given.

BRIEF DESCRIPTION OF THE SEVERAL VIEWS OF THE DRAWINGS

These and other features of the present invention will become apparent from the accompanying detailed description and drawings, wherein.

DETAILED DESCRIPTION

Figure 1:
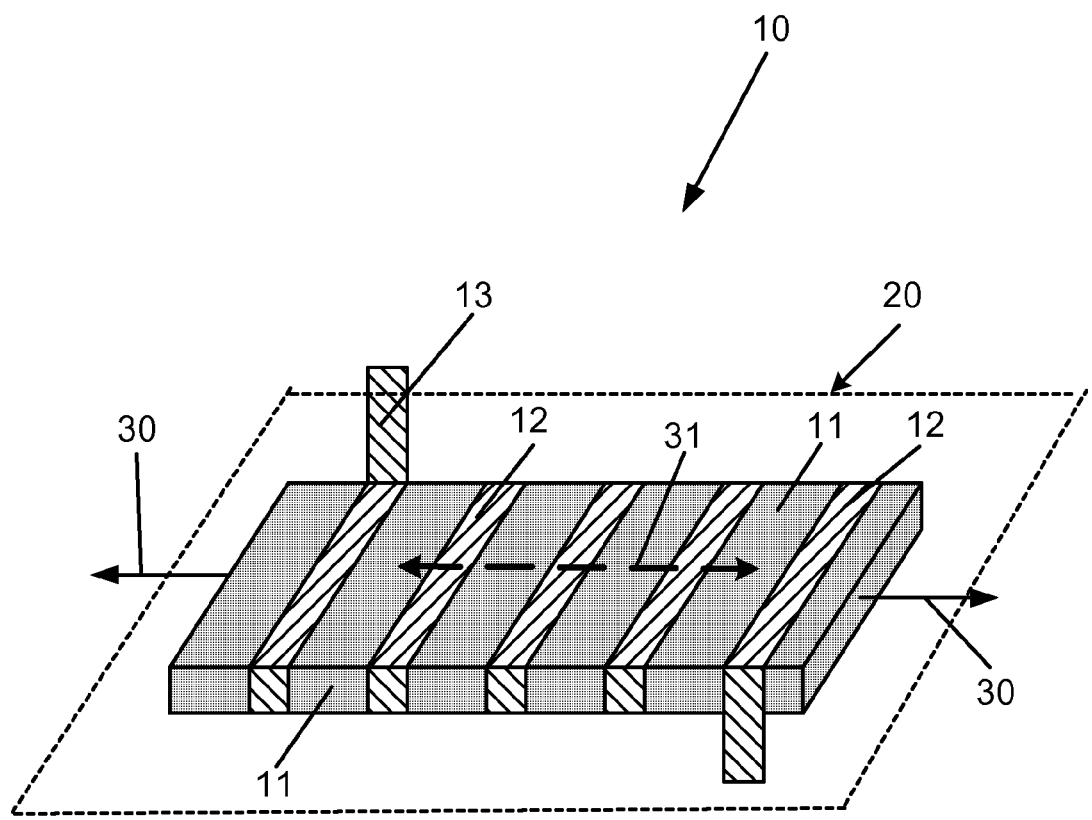
FIG. 1 shows a schematic view of a planar magnetic core inductor with windings on the outside.

Microelectronics progress has been synonymous with decreasing feature sizes. Decreased feature sizes allow for ever higher circuit counts, and increased circuit densities for semiconductor integrated circuits (IC). In today's very large scale integration (VLSI) technical art complete processors, even with multiple computing cores, are integrated onto a single die, or chip. The terms "die" and "chip" are regarded as interchangeable in the present disclosure. It is commonly understood that the vast number of devices in the ICs are in need of elaborate wiring networks for interconnecting devices, distributing power, and other functions known in the art. Such wiring networks are also typically integrated onto the same chips as the electronic components, such as the transistors. The wiring network is often referred to in the art as the back end of the line (BEOL) since its fabrication is typically done late in the processing sequences of a VLSI die.

As it is known in the art the wiring network of a VLSI IC is usually of multiple levels, typically arranged into multiple discrete wiring planes. Modern VLSI circuits are often in need of quite a few of such wiring planes, typically in the range of 4 to 8, but with further integration the number of wiring planes may increase to 10 and beyond. It is usual that the higher the planes are, that is the higher away from the semiconductor components, the bulkier and coarser the wires become. Wire segments on differing wiring planes may be interconnected by so called Vertical Interconnect Access-s (VIAs). VIAs carry the electric current in the direction perpendicular to that of the wiring planes.

Manufacturing of BEOL is well established in the VLSI arts. It is understood that there are a large number of steps involved in such processing, and each step might have practically endless variations known to those skilled in the art. One multilevel wiring fabrication scheme often used in the art is the so-called damascene, or often dual damascene, processing method. State of the art multilevel interconnect structures typically use Cu as the metal for the wires and for the VIAs.

Semiconductor ICs may often be in need of inductors. Such may be the case for analog, or mixed analog/digital circuits. Inductors are also needed as transformers, and as energy storage elements. The use of inductors as energy storage elements came to the fore because the energy consumption of a chip may become a constraint on the performance in VLSI processors. A promising method to increase performance-per-watt of digital ICs may be the so called dynamic voltage and frequency scaling, where the supply voltage and/or clock frequency is adjusted transiently to match required workloads.

A promising way to implement dynamic voltage scaling is to generate and distribute multiple DC supply voltages for a semiconductor IC. Switched-inductor (buck) converters are good candidates for this task since they are capable of delivering high current densities in the necessary voltage ranges. Such ranges may be, without intent of limiting, between 2V and 0.35V. As it is known in the art, a buck converter is suitable for dynamic DC to DC voltage conversion. The various converted voltages may then be distributed into the power supply wiring of the IC, which power supply wiring may be part of the multilevel wiring network of the IC. For such a DC to DC voltage converter to be useful it should be able to supply the various voltages at an adequate current level.

So far in the art inductors that were able to fulfill their roles in switched-inductor converters for ICs have been too bulky for integration directly into the IC chip. Various ways around such problems have been devised, such as stacking several chips, using interposers, and more.

A detailed analysis regarding the needs and figure of merits of inductors has been recently given by N. Sturcken et al., "Design of Coupled Power Inductors with Crossed Anisotropy Magnetic Core for Integrated Power Conversion", IEEE-APEC 2012, pp. 417-423, doi: 10.1109/APEC.2012.6165853, which is incorporated herein by reference in its entirety.

Embodiments of the present invention teach inductor structures and their methods of fabrication, which inductor structures have the energy storage capability needed for modern DC to DC voltage converters, while their size and shape is such that these inductors are fully integrable into the multi-level wiring network, the BEOL, of individual VLSI semiconductor ICs.

Inductors in representative embodiments of the present disclosure are based on a planar magnetic core with a conductive winding, which conductive winding turns around the outside of the planar magnetic core in a generally spiral manner.

FIG. 1 shows a schematic view of a planar magnetic core inductor 10 with windings on its outside. The magnetic core 11 is a planar structure having, and defining, a principal plane 20. The planar magnetic core 11 may typically be of a rectangular shape. The conductive winding 12 of the inductor is made to spiral around the outside of the planar core 11. The conductive winding 12 has leads 13 that may connect to the winding in any desirable manner without limitation.

The direction 30 of a magnetic field that is induced when an electrical current is flowing in the conductive winding 12 is substantially in the principal plane directed substantially along the winding spiral, and pointing in a direction that depends on the direction of the current in the winding. As it is known in the art, many magnetic material are anisotropic, and possess so called hard and soft axes of magnetization. The planar magnetic core 11 in representative embodiments of the invention is fabricated to have its hard-axis 31 of magnetization aligned substantially in parallel with the magnetic field 30 that is induced when an electrical current is flowing in the conductive windings 12. Such an alignment for the material of the magnetic core 11 is desirable because along the hard-axis the core magnetization exhibits less hysteresis and has a substantially linear dependence on the current in the winding 12, resulting in more energy efficient operation of the inductor.

Figure 2A:
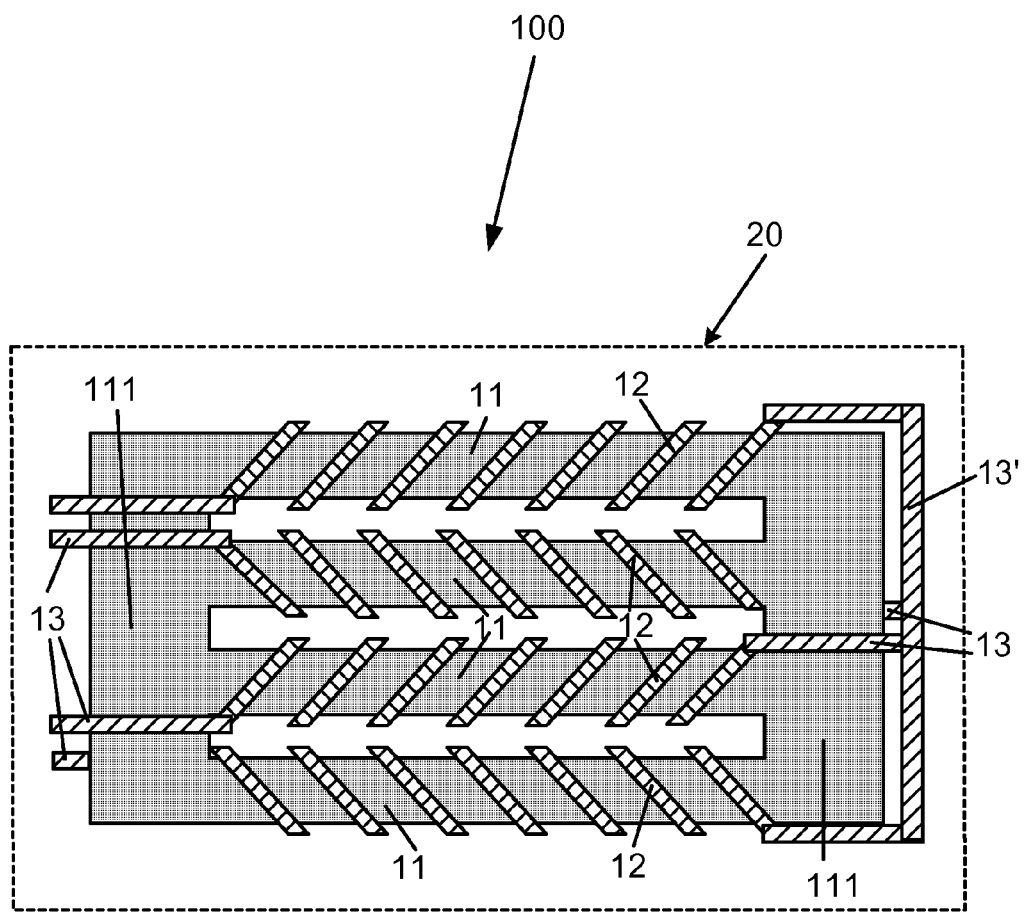
FIG. 2A shows schematic top view of a plurality of inductors of planar magnetic cores with end couplings, and with windings according to an embodiment of the disclosure.

FIG. 2A shows schematic top view of a plurality of inductors 100 of planar magnetic cores with end couplings, and with windings according to an embodiment of the disclosure. The figure shows four magnetic cores 11 in parallel, each capable for being used in an individual inductor, with planar couplers 111 at each of their ends. The planar magnetic cores 11 and the planar couplers 111 are arranged in the principal plane 20 of the magnetic cores, in the manner of a ladder. As a ladder has rungs and stringers, each of the planar magnetic cores 11 corresponds to one of the rungs of the ladder, and each of the planar couplers 111 corresponds to one of the stringers of the ladder. The conductive windings 12 each are made to spiral around the outside of each of the plurality of planar cores 11. FIGS. 1 and 2A are only schematic, and though the parts of the continuous windings underneath the core are not even visible, nonetheless they indicate that the conductive winding 12 may spiral around the magnetic core 11 in many differing ways. Any and all possible manner of winding around the outside of the magnetic core 11 is within the scope of the embodiments of the disclosure.

The number of planar magnetic cores 11 in FIG. 2A is 4. Typically the plurality of inductors 100 in the coupled cores configuration that is shown in FIG. 2A, may range between 2 and 20, but more typically between 2 and 8. The advantages of the magnetic couplers 111 and the optimal manner in what phases are the various magnetic cores 11 driven by the current in the windings 12 is detailed by N. Sturcken et al., "Design of Coupled Power Inductors with Crossed Anisotropy Magnetic Core for Integrated Power Conversion", IEEE-APEC 2012, pp. 417-423, doi: 10.1109/APEC.2012.6165853. FIG. 2A shows that the leads 13 of the windings 12 are all shorted 13' together at one side, and are independent on the other side of the inductors. Such a physical arrangement may be advantageous when the multi-core coupled inductor 100 is used in a DC to DC voltage converter. However, the displayed arrangement of the windings is meant to be understood as an example, and not in a restrictive manner.

Figure 2B:
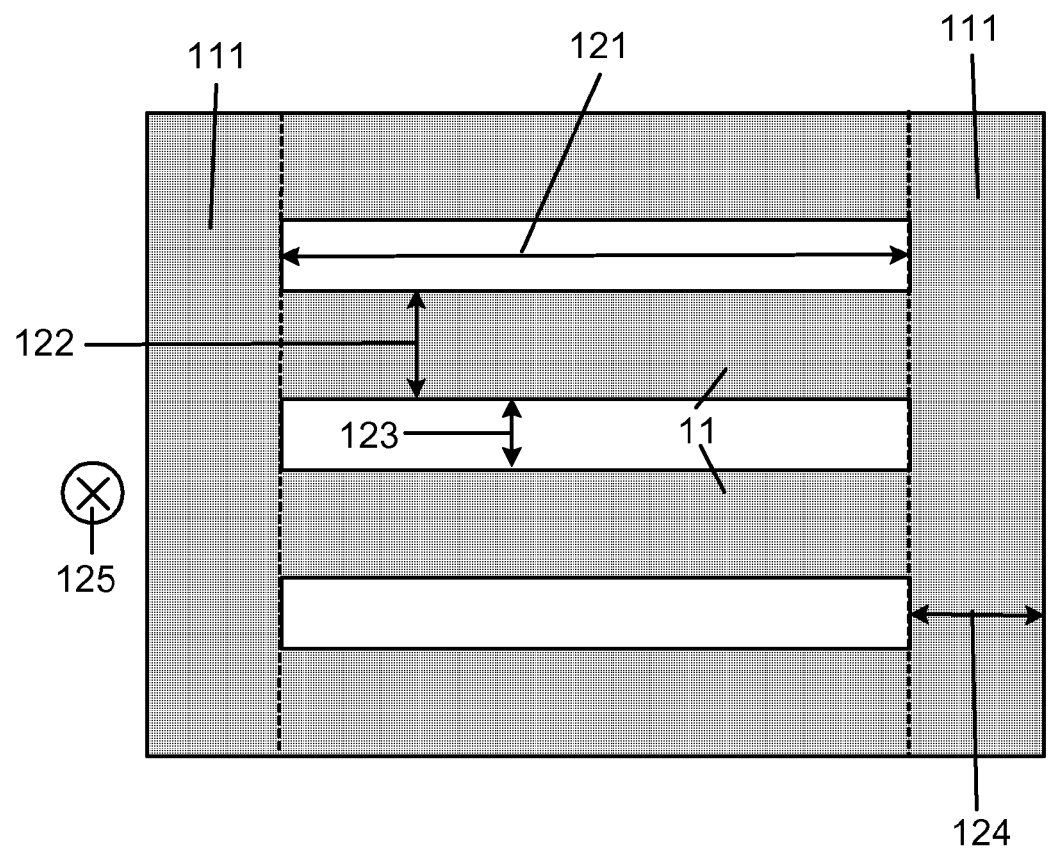
FIG. 2B shows schematic top view of a plurality of planar magnetic cores defining structural dimensions.

FIG. 2B shows schematic top view of a plurality of planar magnetic cores defining structural dimensions. The vertical dashed lines in the figure are present only to guide the eye to distinguish between the magnetic cores 11 and magnetic couplers 111. As before, the stringer/rung terminology will be used as convenient description of the structure. Five parameters may be used to characterize the planar coupled core magnetic structure; length of a core: $L_{rung}$ 121, width of a core: $W_{rung}$ 122, separation of cores $S_{rung}$ 123, width of a coupler $W_{stringer}$ 124, and thickness of the magnetic layer, $T_{core}$ 125 which is only symbolically indicated since it is perpendicular to the plane displayed in FIG. 2B.

As a way of example, and without intent of limiting, finite element numerical simulations have been carried out for the particular case of $L_{rung}$=270 μm, $W_{rung}$=120 μm, $S_{rung}$=50 μm, $W_{stringer}$=140 μm, $T_{core}$=5 μm, and assuming the planar magnetic cores and couplers contain a Co/Zr/Ta (CZT) magnetic material in a laminated configuration. According to the simulation the four coupled inductors are capable of delivering a current density of 11 A/mm$^2$, with magnetic saturation entering at a frequency around 200 MHz. With variations on core materials the inductor may maintain its current density to at least 800 MHz. The total area of the simulated core is 0.35 mm$^2$, a size that is eminently suitable to integrate into the BEOL of a semiconductor IC. The arrangement of the planar cores and their coupling together with the outside windings scheme allow the kind of energy density performance which makes such inductors small enough to integrate into the BEOL of VLSI ICs, while delivering the necessary currents needed for the operation of the ICs at the desired voltage levels.

General trends to find optimal parameter values for the coupled magnetic cores may depend on the following. Increasing $W_{rung}$ will reduce the reluctance for magnetic flux in the core at the expense of winding length, which would increase DC resistance. $S_{rung}$ is desired to be as small as possible in order to maximize coupling between adjacent cores. However, this space must be large enough to accommodate the winding which will be placed between the rungs. Reducing $L_{rung}$ reduces the magnetic path length and increases inductance at the expense of winding wire cross section, which increases DC resistance of the winding. Increasing $W_{stringer}$ helps to improve coupling between cores, but with diminishing effect, while it consumes more total area and hence reduces current density.

FIG. 2B also indicates that it may be advantageous, and in representative embodiments of the disclosure it may be done so, to form the planar magnetic cores 11 and the planar couplers 111 with the same chemical composition. In this manner the planar magnetic cores 11 and the planar couplers 111 are becoming differing portions of a single planar structure, as the one depicted in FIG. 2B.

Embodiment of the present invention may depend on a coupled multi-core planar inductor design with windings on the outside of the cores. Such an inductor design affords high efficiency even at sufficiently high current densities that the inductor can be made small enough to offer the possibility of full integration into a semiconductor IC wiring network. The proper planar shape of the cores further aids with the integration. Any and all optimizations and final dimensions of such an inductor design are within the scope of the embodiments of the instant disclosure.

Figure 3A:
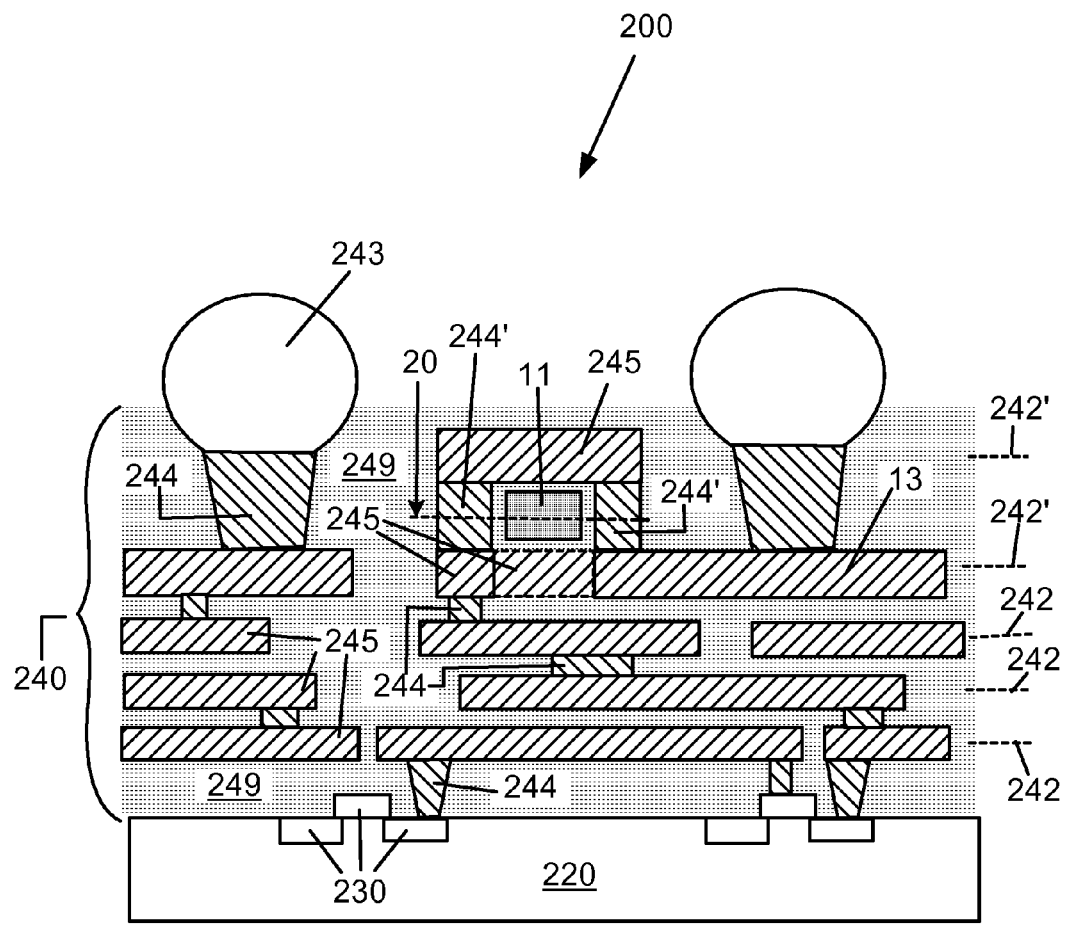
FIGS. 3A-3D show schematic cross sectional views of planar magnetic core inductors integrated into multilevel wiring networks according to various embodiments of the disclosure.

FIGS. 3A-3D show schematic cross sectional views of planar magnetic core inductors integrated into multilevel wiring networks according to various embodiments of the disclosure. FIG. 3A is a schematic cross sectional view of the integration 200 of an inductor into the multilevel wiring network, or BEOL, of a semiconductor IC. The figure shows symbolically represented circuit components 230, such as CMOS devices, have been processed on a semiconductor substrate 220. The devices may be any kind, planar or three dimensional FinFET type, and the substrate, as well, any kind, bulk, SOI, Si based, or some other semiconductor based, without limitation. Pertaining to the same die, and over the semiconductor substrate 220 and the components 230, a multilevel wiring network 240 has been fabricated.

The multilevel wiring network 240 is arranged into wiring planes 242. FIG. 3A depicts 5 wiring planes 242 but without limitation on any actual number of planes. Each wiring plane 242 contains wire segments 245. Electrical connections between wiring planes 242 of differing wiring planes 242 are provided by VIAs 244. Also shown are typical IC chip contact structures 243, usually referred to in the art as C4 contacts, but any other contacts for the chip's external communication are acceptable without limitation. The spaces in the wiring network 240 are typically filled with a dielectric insulating material 249, of which quite a few are known in the art, one of them may be $SiO_2$.

The schematic depiction of FIG. 3A show an inductor with a single planar magnetic core 11 integrated 200 into the multilevel wiring network 240. The principal plane 20 of the planar magnetic core 11 is substantially parallel with the wiring planes 242. The conductive winding of the inductor, forming a general spiral on the outside of the planar magnetic core 11 is piecewise constructed of wire segments 245 and of VIAs 244. The wire segments 245 forming the winding pertain to at least two of the wiring planes 242' and the VIAs 244' that form the parts of the windings that are vertical to the principal plane 20 are interconnecting the at least two wiring planes 242'. The wire segment underneath the planar magnetic core 11 is delineated with dashed lines indicating that, depending how the winding spirals are constructed, it may not be visible in the depicted cross sectional plane. A possible lead 13 to the windings is also shown.

Considering the discussion with reference to FIG. 2B, where in the shown example the 4 core planar magnetic inductor was only 0.35 $mm^2$, and that a semiconductor IC die is typically several square millimeters, the fitting of the inductors in the embodiments of the instant invention into the planes of a wiring network poses no difficulty.

In state of the art semiconductor ICs the multilevel wiring network 240 typically uses Cu for wire segments and VIAs, and it is fabricated with a dual damascene technique, as known in the art. Since the planar magnetic core 11 is manufacturable with usual semiconductor processing methods, for instance, sputtering, or electroplating, its integration may be seamlessly included into the BEOL processing.

Figure 3B:
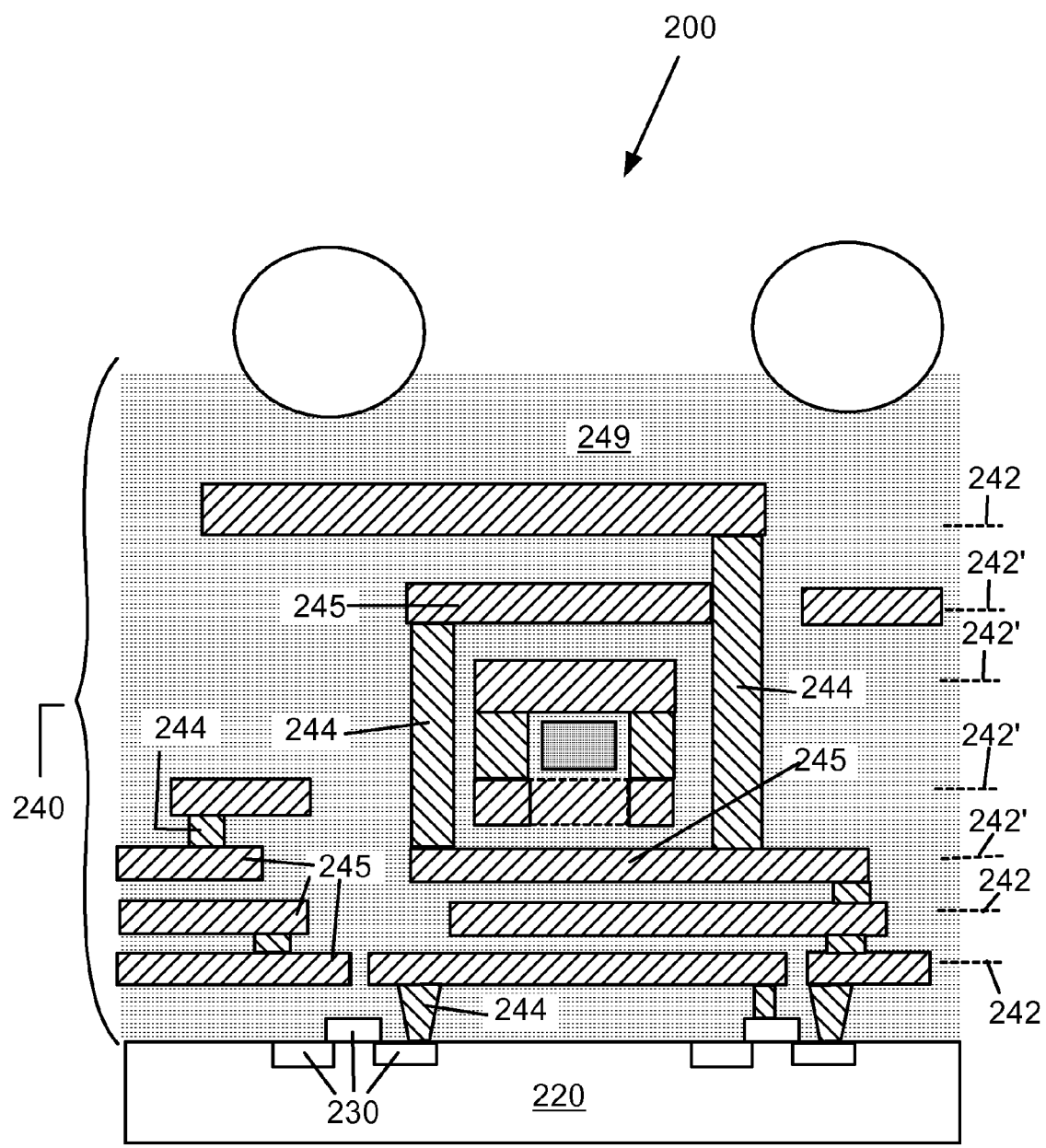

FIG. 3B is a schematic cross sectional view of the integration 200 of an inductor into the multilevel wiring network, or BEOL, of a semiconductor IC in a variant embodiment. The difference compared to FIG. 3A is that FIG. 3B shows a wiring network with more planes, 7, and not only 2, but in the depicted case 4, wiring planes 242' are contributing wiring segments for the windings of the planar core 11. Such arrangements may be useful for some inductor applications, and pose no difficulty for the BEOL processing to achieve.

Figure 3C:
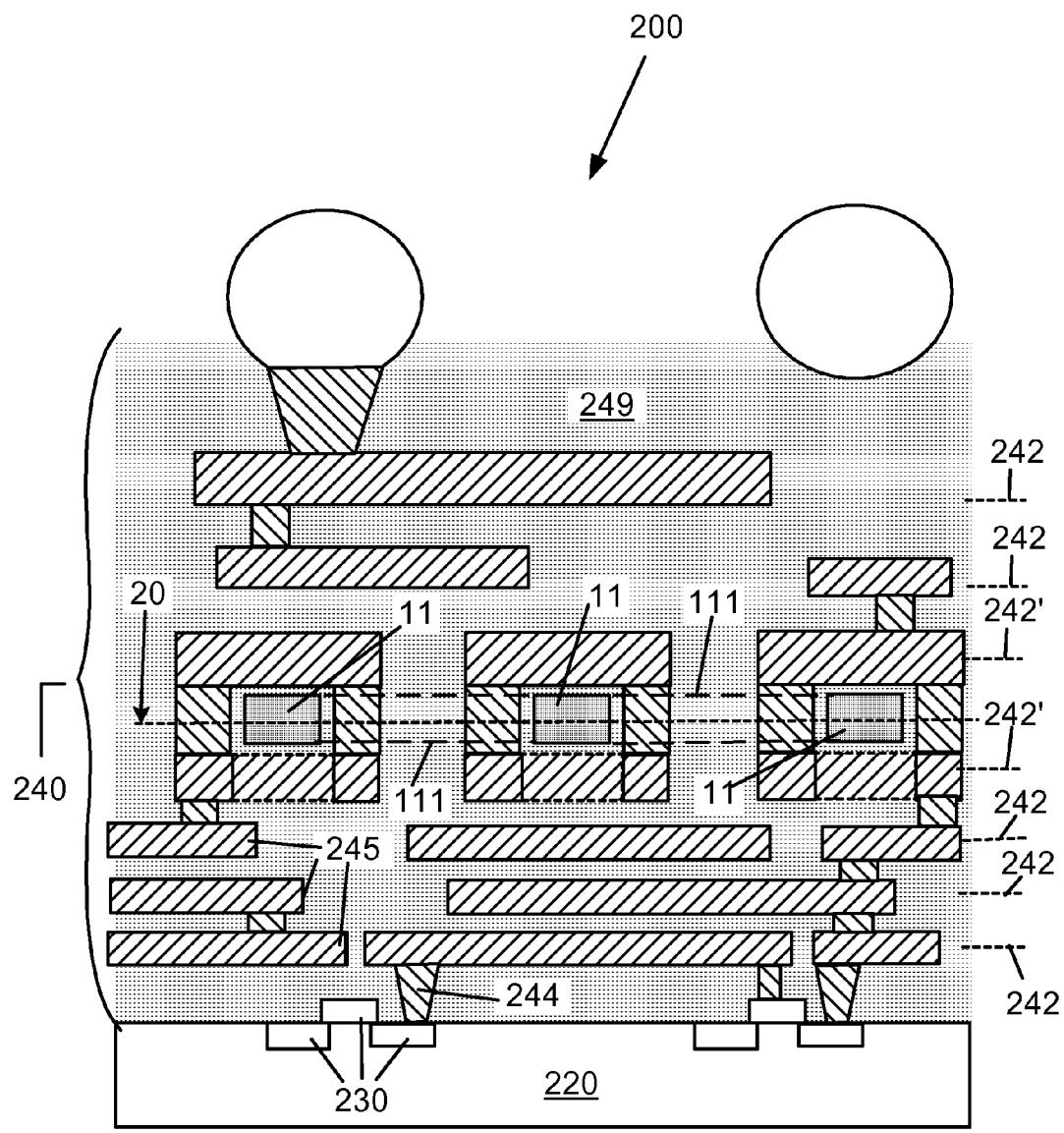

FIG. 3C is a schematic cross sectional view of the integration 200 of a multi-core inductor into the multilevel wiring network, or BEOL, of a semiconductor IC. Considering the discussions and notations in reference to FIGS. 3A and 3B that carry over to FIG. 3C, only a brief explanation is given here. An integration of a three core planar magnetic core 11 inductor between two wiring planes 242' is shown as another embodiment of the instant disclosure. The magnetic coupler 111 is indicated between dashed lines because obviously it would not be visible in the presented cross sectional view.

Figure 3D:
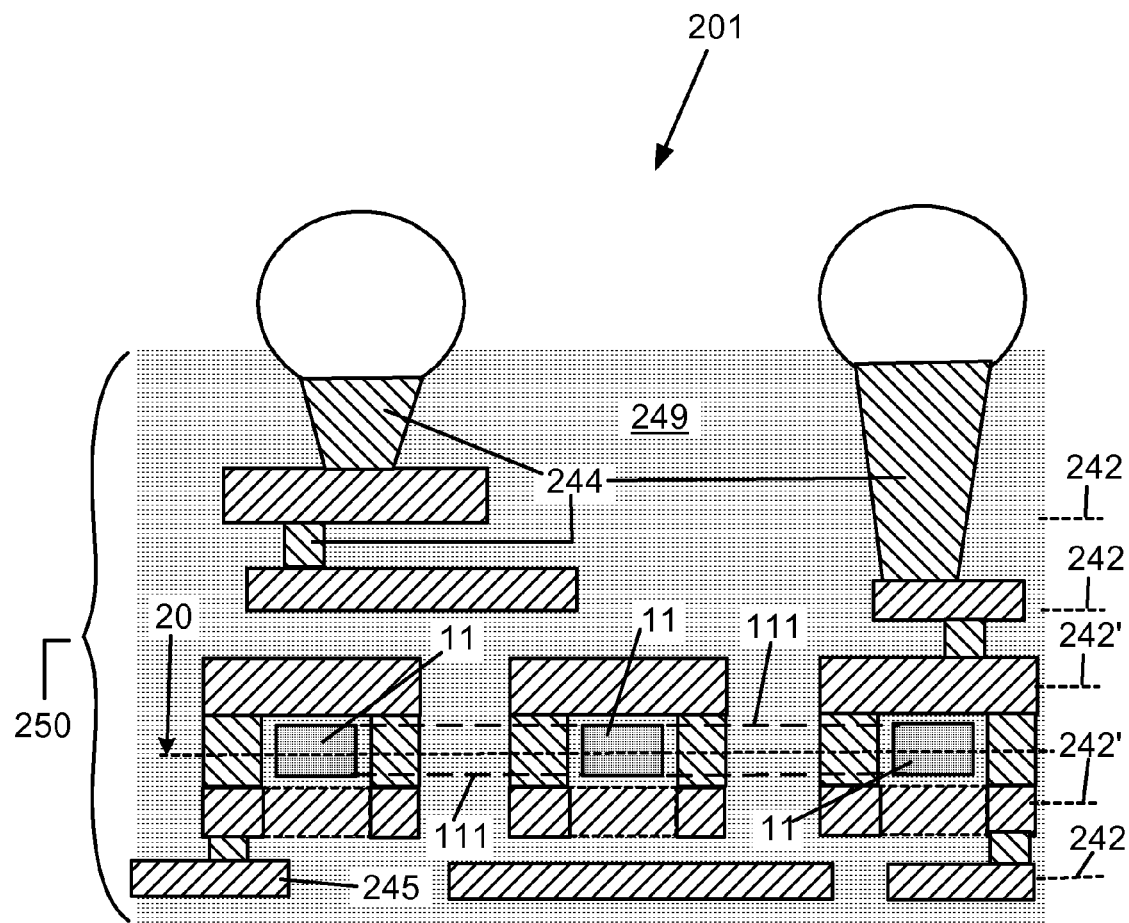

FIG. 3D is a schematic cross sectional view of the integration 201 of a multi-core inductor into the wiring planes of a multilevel wiring network. The inductor may be integrated into the wiring planes 242, 242' of a multilevel wiring network 250 when that wiring network does not pertain to a semiconductor IC. If the need arises, the inductor in the embodiments of the instant invention may be integrated in a wiring network of some sort chip auxiliary to a semiconductor IC. Such auxiliary chip may be an interposer, between a power supply and a semiconductor IC. Or, maybe a power supply chip delivering power through contacts to an semiconductor IC. Such auxiliary chip may also be a chip containing some components for an analog circuit. Any and all such structures and their applications are within the scope of the embodiments of the present invention, where the inductor is integrated into the wiring planes 242, 242' of a multilevel wiring network 250. Here too, the integration of a three core planar magnetic core 11 inductor between two wiring planes 242' with magnetic coupler 111 outside plane of the figure is shown. Such multilevel wiring network 250 arranged into wiring planes may be supported by any and all type of substrates, or it may be completely free standing by itself. Because of the possibility of so many variations no one particular substrate is shown in the figure. FIG. 3D shows C4 contacts, but these are optional, as well.

Figure 4A:
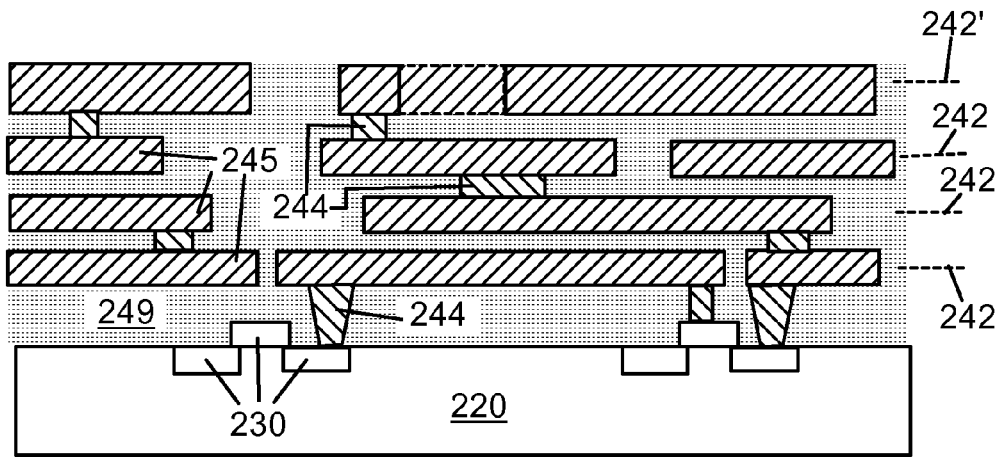
FIGS. 4A-4C show schematic cross sectional views of steps in the integration of a planar magnetic core into a multilevel wiring networks according to an embodiment of the disclosure.
Figure 4B:
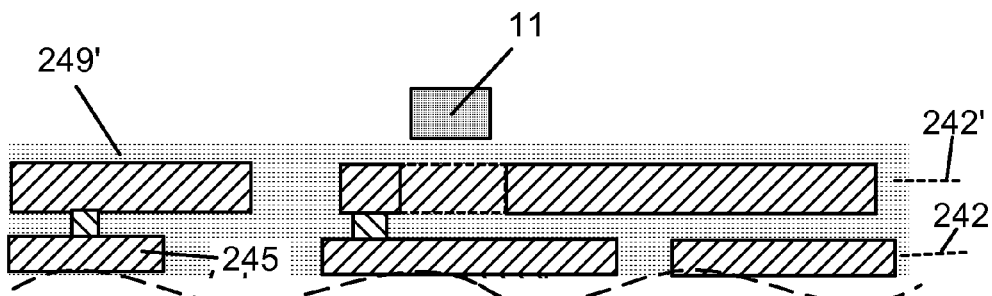
Figure 4C:
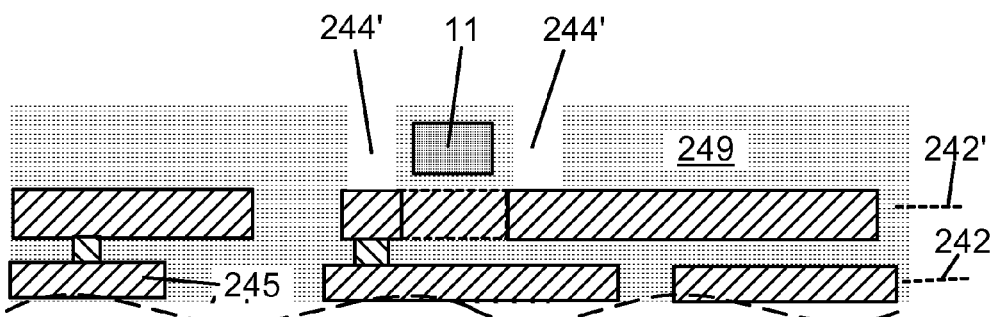

FIGS. 4A-4C show schematic cross sectional views of steps in the integration of a planar magnetic core into a multilevel wiring networks according to an embodiment of the disclosure. Considering the planar configuration of the magnetic cores and couplers and that the winding is applied on the outside of the cores, there are several possible ways to integrate the inductor into a multilevel wiring network. The term "integration" is used throughout herein with its customary meaning of bringing together, incorporate into a whole, to be part of the whole, etc.

As already stated earlier, multilevel wiring networks for state of the art semiconductor ICs typically are fabricated by a dual damascene process. This process is well known in the art therefore it will not be discussed here in detail. The dual damascene process is particularly suitable for the integration of the planar magnetic cores and couplers. For representative embodiments of the disclosure the planar magnetic cores and couplers are integrated into the BEOL as part of a dual damascene process. FIGS. 4A-4C depict by way of an example the integration of one core into the multilevel wiring network of a semiconductor IC. Integration of multi-cores with couplers would follow in obvious manner from the process of the depicted example of a single core integration.

FIG. 4A shows the stage when the double damascene processing of the multilevel wiring network reached a point of having a planarized surface, with wiring segments of the last the wiring plane 242' still exposed at the top. The next step in a standard dual damascene process would be to deposit a layer of the insulating material 249 over the last wiring plane of sufficient thickness to accommodate the height of the VIAs that will connect to the next higher wiring level. For the case of integrating a magnetic core into the multilevel wiring network of the instant invention one also deposit a layer of the insulating material 249' as shown in FIG. 4B, but one that is only a portion of the eventual full thickness. The magnetic core 11 is then fabricated on the top of this partial thickness insulator layer 249' to its proper location. FIGS. 4B-4C show only the top part of the multilevel wiring network where the integration takes place. It is understood that the bottom part is unchanging and it is the same as that of FIG. 4A.

FIG. 4C shows the state of integration progressed further. After having completed the fabrication of the magnetic core 11, the insulator layer 249 with further deposition is completed to its needed thickness to accommodate the VIAs. During this further deposition the core 11 is buried into this last layer of the insulator. Next, following now again the standard double damascene processing VIA holes 244' are patterned into the last layer of the insulator. Amongst the many VIA holes at this level, there are those 244' that will be filled with VIAs that will be part of the inductor's winding, as shown in FIG. 4C. From here on, it is standard double damascene processing, VIA filling next, followed by further levels, and so on, finally with contacts such as C4s. Having done these steps one arrives to the structure depicted in FIG. 3A: the completed BEOL with the planar magnetic core 11 having been integrated. It is understood that the insulator level that contains the planar magnetic core 11 is made of the right thickness to have the winding—made up of wire segments and VIAs—with the desired separation from the core.

FIGS. 4A-4C have shown, by way of example, integration of the inductor into the steps of a dual damascene process. It is understood that the planar structure of the core and the outside the core winding scheme allows integration of into the processing steps of practically any BEOL technique, such as single damascene, electroplating, and others.

Figure 5:
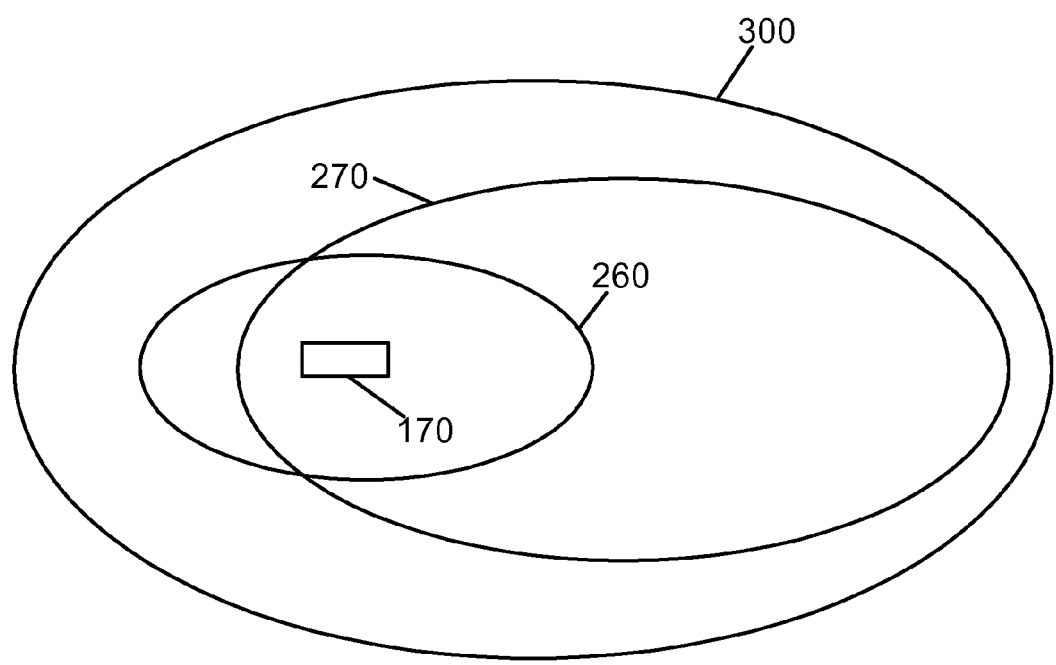
FIG. 5 symbolically depicts a processor with a device that uses a planar magnetic core inductor according to an embodiment of the disclosure.

FIG. 5 symbolically depicts a processor with a device that uses a planar magnetic core inductor according to an embodiment of the disclosure. The term processor is used in the broadest sense; encompassing any kind of computing device, including, but not limited to mainframes, supercomputers, servers, personal computers, mobile devices, hand-held devices, battery powered computer devices, imbedded processors, and others. The processor 300, includes a semiconductor integrated circuit 270. The semiconductor integrated circuit 270 operates with a plurality of DC supply voltages. The plurality of such DC supply voltages may range between 2 to 10. The processor 300 has a DC to DC voltage converter 260, which delivers at least one of the DC supply voltages for the semiconductor integrated circuit 270. The whole of the DC to DC voltage converter 260 may, or may not, be fully integrated into the semiconductor integrated circuit 270, but an inductor 170 that is part of the DC to DC voltage converter 260 is fully integrated into the multilevel wiring network of the semiconductor integrated circuit 270. The circle symbolizing the DC to DC converter 260 in FIG. 5 would imply that the whole of the DC to DC converter 260 is not integrated into the semiconductor integrated circuit 270, but this is for example only nor for limitation.

The inductor 170 includes a planar magnetic core and a conductive winding, with the conductive winding turning around in generally spiral manner on the outside of the planar magnetic core. The multilevel wiring network may be arranged into wiring planes that are parallel with a principal plane of the planar magnetic core. The conductive winding may be piecewise constructed of wire segments and of VIAs, in a manner that the wire segments pertain to at least two of the wiring planes and the VIAs are interconnecting the at least two wiring planes. The planar magnetic core of the inductor 170 may have multiple cores coupled to each other in a ladder like manner.

Figure 6:
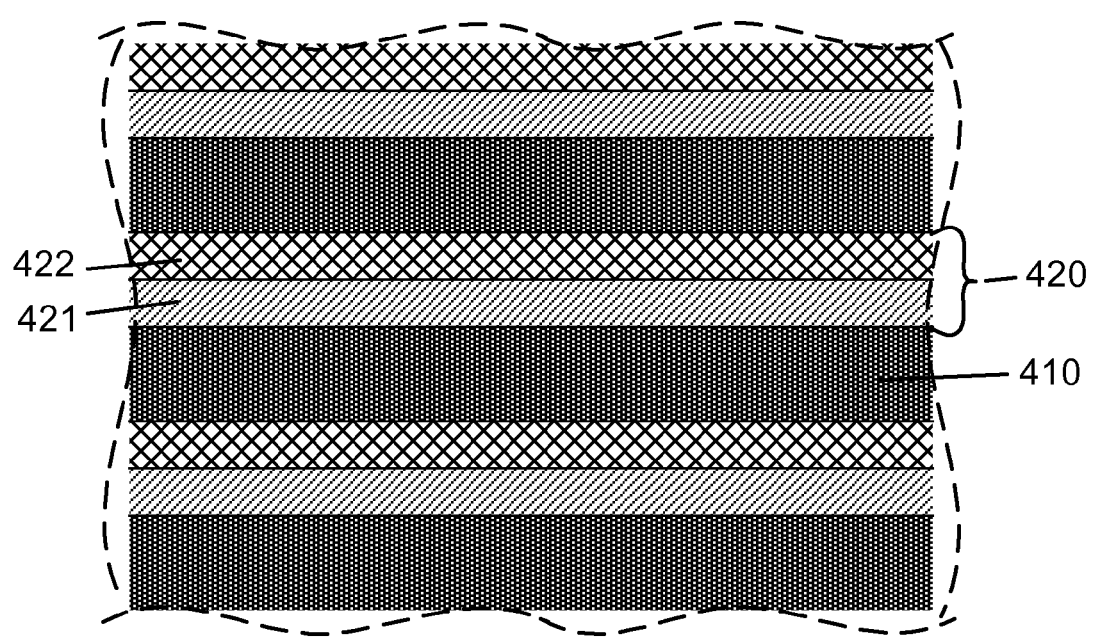
FIG. 6 is a cross sectional view of the laminated composition of a planar magnetic core according to an embodiment of the disclosure.

FIG. 6 is a cross sectional view of the laminated composition of a planar magnetic core 11 according to an embodiment of the disclosure. The laminated configuration includes at least one layer of a magnetic material 410 and at least one non-magnetic layer 420. The purpose of the non-magnetic layer 420 is to prevent electrical current circulation in the planar magnetic core perpendicularly to the principal plane 20, which principal plane is parallel with the lamination layers. In a typical embodiment of the disclosure the magnetic core 11 may contain an alternating sequence of up to 100 layers each, more typically between 2 to 50 periods of the layers. FIG. 6 shows 3 periods of the layers, 3 magnetic ones 410 and 3 non magnetic ones 420.

By way of example, without intent of limiting, the magnetic layer may be of CZT, or $Co_XZr_YTa_{1-X-Y}$, with X and Y being approximately 0.915 and 0.04, respectively. The non-magnetic layer 420 itself may be composed of more than one constituent layers. Again, by way of example, these component layers may be an insulator layer 421, such as $SiO_2$, or CoO, and a metal layer 422, such as Ta. The purpose of the insulating layer 421 is to prevent electrical current circulation in the planar magnetic core perpendicularly to the principal plane 20. Such perpendicular currents are known in the art as Eddy currents, and they would lead to energy losses for the inductor. The purpose of the metal layer 422, such as Ta, may be to ease fabrication by smoothing the surface during deposition. The non-magnetic layer 420 may have structures and properties beyond those of simply having constituent layers. In some embodiments of the present invention the non-magnetic layer 420 may have current rectifying properties.

The sequential deposition of the various layers of the laminated structure may include some techniques known in the semiconductor processing arts, for instance, masking, sputtering, electroplating. The fabrication of the laminated magnetic cores may be done in the presence of an applied magnetic field to help with the orientation of the deposited magnetic layers 410. The thickness of the non-magnetic layers 420 may be in the range of about 5 nm to 100 nm, while the magnetic layer thickness 410 may be of 10 nm to 1000 nm, more typically between 50 nm to 500 nm. Of course, one may be able to apply other magnetic materials, such as Ni and Fe, and other layers, or means, to suppress Eddy currents. Embodiments of the present invention do not limit any of these choices.

Considering the nature of its materials and its structural requirements, representative embodiments of the invention may use differing general approaches for fabricating the planar laminated magnetic cores and couplers. A general approach may be centered on sputtering, another approach on electroplating.

Figure 7A:
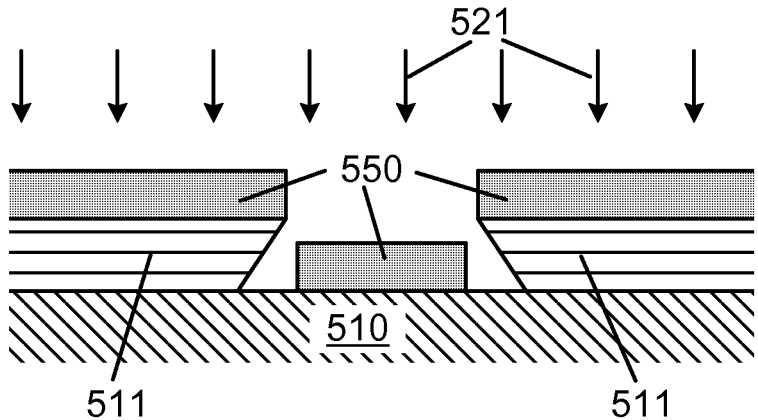
FIGS. 7A-7B show schematic views of embodiments for fabricating laminated planar magnetic cores and couplers by sputtering.
Figure 7B:
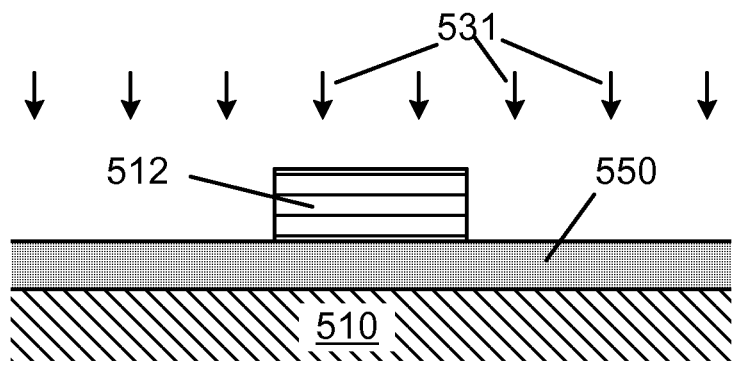

FIGS. 7A-7B show schematic views of embodiments for fabricating laminated planar magnetic cores and couplers by sputtering. In general high vacuum (HV) sputtering is preferred. The approaches one may take differ depending whether it is possible to etch the magnetic material and the non-magnetic layer with the same etchant. If there is no known common enchant, for instance, as in the case when the magnetic material is CZT and the non-magnetic layer comprises a $SiO_2$ layer, one may apply a negative masking resist and a liftoff process as know in the art. One stage in this process is schematically shown in FIG. 7A.

The planar magnetic core is to be fabricated onto the surface of a receiving platform 510. Such a receiving platform in typical embodiments of the instant invention would be the dielectric insulating material, 249' if FIG. 4B, in the multi-level wiring network of a semiconductor IC. A negative photoresist 511 has been disposed onto the receiving platform 510 patterned and opened up, preferably with an undercut, as shown in FIG. 7A. The layers of a magnetic material and the non-magnetic layer are alternatively disposed by sputtering 521, up to 100 layers each, but more typically between 2 to 50 layers each. The layers of the magnetic material may be 10 nm to 1000 nm thick, but more typically between 50 nm to 500 nm thick. The result is a magnetic member with a laminated configuration 550. After dissolving the masking material 511, which lifts off the unwanted portions of the magnetic member 550, the remaining portion of the magnetic member on the surface of the receiving platform 510 is of the proper shape to contain a planar magnetic core.

When all the layers of the laminated magnetic cores and couplers are etchable in the same process one may use HV sputtering with a positive photoresist, a stage of which is shown in FIG. 7B. The sputtering deposition and parameters of the layers of a magnetic material may proceed as discussed with reference to FIG. 7A. An insulating layer of the non-magnetic layer may be an oxide of Co, Ni, or Fe. Alternatively, the sputtering of the magnetic material may continue uninterrupted, but when an insulating layer is needed one introduces reactive oxygen sputter deposition and the insulating layer will be formed by an oxide of the magnetic material itself, such as CZT. In this embodiment the magnetic member 550 is blanket formed over the receiving platform 510. When the sputtering deposition is finished a masking layer is deposited and patterned 512 over the magnetic member. Next an etching step 531 is performed, which may be a wet etch or a dry etch. With the unwanted portions of the magnetic member 550 etched away, the remaining portion of the magnetic member on the surface of the receiving platform 510 is of the proper shape to contain a planar magnetic core. For the specific case of CZT magnetic layers with CoO insulating layers, a viable wet etchant may be based on HCl, while a dry etch process may use a plasma formed from chlorine gas.

In both approaches shown in FIGS. 7A and 7B respectively, the masking and patterning for the magnetic member is done in such a manner that a remaining portion of the magnetic member 550 includes a planar magnetic core, or a plurality of cores and possibly magnetic couplers.

Electroplating is an alternative process for fabricating the laminated magnetic cores and couplers. The advantage of electroplating is its simplicity coupled with being relatively inexpensive. The difficulty with the electroplating is that the current required for the plating should be able to flow through the already deposited material. Consequently, the insulating layers of the laminated material would stop the electrodeposition process by blocking the current needed for the deposition. Embodiment of the instant disclosure find the way around this problem by electrodepositing such non-magnetic layers that are rectifying, instead of being insulators. Current rectifying layers are also suitable to suppress Eddy currents in the core, since in order for Eddy currents to circulate they would have to cross the current rectifying layers from both direction, which the rectifying layers would prevent. On the other hand, if the direction of the plating current is chosen correctly, it may flow through the current rectifying layers.

Rectification may be included in the non-magnetic layers, for instance, based on Schottky diodes. Onto the magnetic material layer one may electrodeposit the following sequence: a semiconducting layer—p-type with work function less than magnetic layer or n-type with work function greater than magnetic layer—; followed by an interface metal layer—with a work function less than that of p-type semiconducting material, or greater than that of n-type semiconducting material. Then, continue with the next magnetic material layer, and so on.

Alternatively, for rectification one may use a semiconductor p-n junction in the non magnetic layer. Any semiconductor may be suitable, one would have to choose one based on several criteria, for example without limiting, the ease of contact to the magnetic material of the p and n portions, how narrow can one make the junction, and others.

Figure 8:
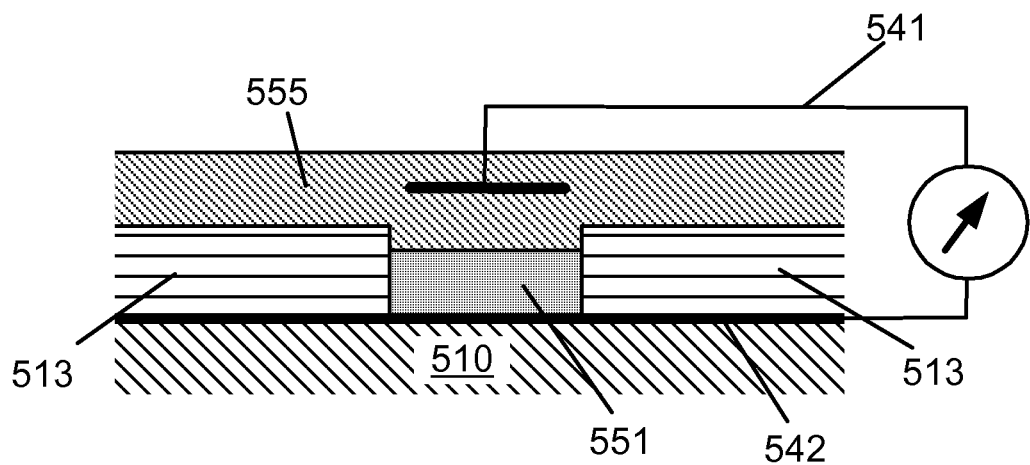
FIG. 8 shows a schematic view of fabricating laminated planar magnetic cores and couplers by electroplating.

FIG. 8 shows a schematic view of fabricating laminated planar magnetic cores and couplers by electroplating. The nature of the non-magnetic layers is as discussed above, and will not be repeated here. Same as with sputtering deposition, embodiments the planar magnetic core is to be fabricated onto the surface of a receiving platform 510. Such a receiving platform in typical embodiments of the instant invention would be the dielectric insulating material, 249' in FIG. 4B, in the multilevel wiring network of a semiconductor IC. Onto the receiving platform 510 one may deposit a conductive seed layer 542, for instance Al, Cu, or a magnetic alloy, such as, for instance, $Ni_xFe_{1-x}$ with x being approximately 0.45 to 0.80. A masking layer 513 is deposited over the conductive seed 542, and patterned to have an opening with the proper shape for cores and couplers. Next, the layers of a magnetic material and the non-magnetic layer are alternatively electrodeposited from the plating solution 555. Such electroplating solutions are know in the art. The electrodeposition may proceed for 100 layers each, but more typically between 2 to 50 layers each. The layers of the magnetic material may be 10 nm to 1000 nm thick, but more typically between 50 nm to 500 nm thick. All the while the conductive seed layer 542 completes a path 541 for the electrodeposition current. The layers, of course, will only deposit into the opening in the masking material since the masking material is an insulator. When the required number of layers have been deposited the masking layer 513 is removed and portion of the conductive seed layer 542 is exposed. Once the exposed portion of the conductive seed layer is removed, a planar magnetic formation 551 with a laminated configuration is left in place. Because of the masking 513 this magnetic formation 551 already includes at least one planar magnetic core, and possibly a plurality of cores, with couplers.

All of these various depositions processes are devised to serve a method which is characterized as fabricating a planar inductor suitable for integrating into a multilevel wiring network that is arranged into wiring planes.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as "under," "upper", "side," "over", "underneath", "parallel", "perpendicular", "vertical", etc., as used herein refer to relative location and orientation of various portions of the structures with respect to one another, and are not intended to suggest that any particular absolute orientation with respect to external objects is necessary or required.

The foregoing specification also describes processing steps. It is understood that the sequence of such steps may vary in different embodiments from the order that they were detailed in the foregoing specification. Consequently, the ordering of processing steps in the claims, unless specifically stated, for instance, by such adjectives as "before", "ensuing", "after", etc., does not imply or necessitate a fixed order of step sequence.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art. The scope of the invention is defined by the appended claims.

The invention claimed is:

1. A method, comprising:
    depositing by high-vacuum (HV) sputtering a layer of a magnetic material on a first insulating layer, said first insulating layer disposed on a first wiring plane of a multilevel wiring network, said magnetic material having a thickness between about 10 nm and 1000 nm;
    disposing a second insulating layer over said layer of said magnetic material;
    repeating in alternate fashion said depositing step and said disposing step up to about 100 times each, resulting in a magnetic member with a laminated configuration;
    masking and patterning for said magnetic member in such manner that after said patterning a remaining portion of said magnetic member comprises a planar magnetic core; and
    wherein said method is characterized as fabricating a planar inductor suitable for integrating into said multilevel wiring network that is arranged into wiring planes, wherein said inductor comprises said planar magnetic core.

2. The method of claim 1, wherein in said disposing step said magnetic material is oxidized, wherein forming said insulating layer.

3. The method of claim 1, wherein said method further comprises selecting a material for said insulating layer in such manner that said insulating layer is commonly etchable with said layer of said magnetic material.

4. The method of claim 3, wherein said magnetic material comprises $Co_XZr_YTa_{1-X-Y}$, and said material for said insulating layer comprises CoO.

5. The method of claim 1, wherein said steps of masking and patterning comprise a liftoff process.

6. The method of claim 1, wherein said steps of masking and patterning comprise developing a positive photoresist over said magnetic member and etching away an unneeded portion of said magnetic member.

* * * * *